United States Patent [19]
Farkas et al.

[11] Patent Number: 5,614,444
[45] Date of Patent: Mar. 25, 1997

[54] METHOD OF USING ADDITIVES WITH SILICA-BASED SLURRIES TO ENHANCE SELECTIVITY IN METAL CMP

[75] Inventors: Janos Farkas; Rahul Jairath, both of Austin, Tex.; Matt Stell, Folsom, Calif.; Sing-Mo Tzeng, Austin, Tex.

[73] Assignees: Sematech, Inc., Austin, Tex.; Intel Corporation; National Semiconductor Corp., both of Santa Clara, Calif.; Digital Equipment Corp., Maynard, Mass.

[21] Appl. No.: 469,164

[22] Filed: Jun. 6, 1995

[51] Int. Cl.$^6$ ................................................. H01L 21/302
[52] U.S. Cl. .................... 437/225; 437/228; 156/645.1
[58] Field of Search ............................ 156/645.1, 636.1; 216/89, 88; 437/228, 225

[56] References Cited

U.S. PATENT DOCUMENTS

| | | | |
|---|---|---|---|
| 4,702,792 | 10/1987 | Chow et al. | 156/628 |
| 4,944,836 | 7/1990 | Beyer et al. | 156/645.1 |
| 4,954,142 | 9/1990 | Carr et al. | 51/309 |
| 5,084,071 | 1/1992 | Nenadic et al. | 51/309 |
| 5,225,034 | 7/1993 | Yu et al. | 156/636.1 |
| 5,244,534 | 9/1993 | Yu et al. | 437/228 |
| 5,358,743 | 10/1994 | Hampden-Smith et al. | 427/282 |
| 5,391,258 | 2/1995 | Brancaleoni et al. | 216/89 |

OTHER PUBLICATIONS

"Selective CVD Of Copper On Tungsten Versus SiO2 From (B–diketonate)CuLn Copper (I) Precursors Via SiO2 Surface Modification;"Jain et al.; Advanced Metallization for ULSI Applications 1992; Conference Proceedings ULSI–VIII; Materials Research Society; Oct. 20–22, 1992;pp. 83–89.

"FTIR Studies Of Silica Surface Passivation And Subsequent Adsorption/Desorption Of Copper Metalorganic Precursors;" Farkas et al.; Suface Chemical Cleaning and Passivation for Semiconductor Processing; Mat. Res. Soc. Symp. Proc. vol. 315; Materials Research Society; Apr. 13–15, 1993; pp. 97–104.

"Passivation Of Silicon Dioxide Surface Hydroxyl Groups To Control Selectivity During Chemical Vapor Deposition Of Copper From Copper (I) Compounds;" Jain et al.; Surface Chemical Cleaning and Passivation for Semiconductor Processing; Mat. Res. Soc. Symp. Poc. vol. 315; Materials Research Society; Apr. 13–15, 1993; pp. 105–110.

"Effect Of Polishing Pad Material Properites On Chemical Mechanical Polishing (CMP) Processes;" Bajaj et al.; Advanced Metallization for Devices and Circuits—Science, Technology and Manufacturability; Mat. Res. Soc. Symp. Proc. vol. 337; Materials Reserach Society; Apr. 4–8, 1994; pp. 637–644.

(List continued on next page.)

*Primary Examiner*—Trung Dang
*Attorney, Agent, or Firm*—Kidd & Booth, LLP

[57] ABSTRACT

A method of using additives with silica-based slurries to enhance metal selectivity in polishing metallic materials utilizing a chemical-mechanical polishing (CMP) process. Additives are used with silica-based slurries to passivate a dielectric surface, such as a silicon dioxide ($SiO_2$) surface, of a semiconductor wafer so that dielectric removal rate is reduced when CMP is applied. The additive is comprised of at least a polar component and an apolar component. The additive interacts with the surface silanol group of the $SiO_2$ surface to inhibit particles of the silica-based slurry from interacting with hydroxyl molecules of the surface silanol group. By applying a surface passivation layer on the $SiO_2$ surface, erosion of the $SiO_2$ surface is reduced. However, the metallic surface is not influenced significantly by the additive, so that the selectivity of metal removal over oxide removal is enhanced.

14 Claims, 6 Drawing Sheets

OTHER PUBLICATIONS

"Oxidation And Etching Of Tungsten In CMP Slurries;" Farkas et al.; Advanced Metallization for ULSI Applications in 1994; Conference Proceedings ULSI-X; Materials Research Society; Oct. 4–6, 1994; pp. 25–32.

"Chemical–Mechanical Polishing for Fabrication Patterned W Metal Features as Chip Interconnects;" Kaufman et al.; J. Electrochem. Soc., vol. 138, No. 11, Nov. 1991; pp. 3460–3465.

"Tribology Analysis of Chemical–Mechanical Polishing;" Runnels et al.; J. Electrochem. Soc., vol. 141, No. 6; Jun. 1994; pp. 1698–1701.

"FTIR Studies of the Adsorption/Desorption Behavior of Cu Chemical Vapor Deposition Precursors on Silica;" Farkas et al.; J. Electrochem. Soc., vol. 141, No. 12; Dec. 1994; pp. 3539–3546.

"FTIR Studies of the Adsorption/Desorption Behavior of Cu Chemical Vapor Deposition (CVD) Precursors on Silica;" Farkas et al.; J. Electrochem. Soc., vol. 141, No. 12; Dec. 1994; pp. 3547–3555.

"Control of selectivity during chemical vapor deposition of copper from copper (I) compounds via silicon dioxide surface modification;" Jain et al.; Appl. Phys. Lett. 61 (22); 30 Nov. 1992; pp. 2662–2664.

"Selective and blanket copper chemical vapor depositon for ultra–large–scale integration;" Jain et al.; J. Vac. Sci. Technol. B 11(6); Nov./Dec. 1993; pp. 2107–2113.

"FTIR Studies of the Adsoprtion/Desorption Behavior of Copper Chemical Vapor Deposition Precursors on Silica. 1. Bis (1,1,1,5,5,5–hexafluroroacetylacetonato) copper (II);" Farkas et al.; The Journal of Physical Chemistry, vol. 98, No. 27; 1994; pp. 6753–6762.

"FTIR Studies of the Adsorption/Desorption Behavior of Copper Chemical Vapor Deposition Precursors on Silica. 2. (1,1,1,5,5,5–Hexafluroracetylacetonato) (2–butyne) copper (I);" Farkas et al.; The Journal of Physical Chemistry, vol. 98, No. 27; 1994; pp. 6763–6770.

"Overview of Metal CVD;" Kodas et al.; Chapter 9 of The Chemistry of Metal CVD; pp. 429–499; VCH Verlagsgesellschaft mbH, Weinheim (Germany) and VCH Publishers Inc., New York, NY.; 1994.

METHOD OF USING ADDITIVES WITH SILICA-BASED SLURRIES TO ENHANCE SELECTIVITY IN METAL CMP

BACKGROUND OF THE INVENTION

1. Field of the Invention

The present invention relates to the field of semiconductor manufacturing techniques and, more particularly, to slurries utilized in chemical-mechanical polishing.

2. Prior Art

The manufacture of an integrated circuit device requires the formation of various layers (both conductive and non-conductive) above a base substrate to form the necessary components and interconnects. During the manufacturing process, removal of a certain layer or portions of a layer must be achieved in order to pattern and form various components and interconnects. Generally, this removal process is termed "etching."

One of the techniques available for removal of material from a semiconductor wafer is known as the chemical-mechanical polishing (CMP) process, in which a chemical slurry is used along with a polishing pad. The mechanical movement of the pad relative to the wafer in combination with the chemical reaction of the slurry provide the abrasive force for removing the exposed surface of the wafer. A variety of CMP tools are available to perform this type of polishing. Improvements are currently being sought in the areas of pad and slurry composition and usage, all to obtain better control over existing CMP practices.

One area of CMP pertains to the removal of metallic materials. CMP of metals can be used to define vertical and horizontal wiring in semiconductor wafers, such as a silicon wafer. This process requires high selectivity in removal rate of metals versus dielectric surfaces, such as a silicon dioxide layer, to insure small oxide erosion on patterned structures. Silicon dioxide ($SiO_2$) abrasives are commonly used to polish dielectric layers. However, because alumina particles have lower chemical reactivity than silica particles on $SiO_2$, CMP of a metal layer is predominantly accomplished with alumina slurries to provide acceptable selectivity. Without this higher selectivity, undesirable amounts of the $SiO_2$ layer will be polished away with the metal. However, there are a number of disadvantages associated with the use of alumina slurries.

Alumina slurries are generally more costly to use as compared to silica slurries. The added cost increases the cost of manufacturing integrated circuits on wafers. Generally, alumina slurries are defect prone and are more difficult to disperse than silica slurries. The defects are the result of scratches left on the polished surface by the alumina slurry, mainly due to the polishing by larger size and harder alumina particles.

Thus, it is appreciated that reliance on silica slurries is more beneficial than using alumina slurries for polishing metals, but only if the selectivity is sufficiently high to limit the erosion of oxide layers to an acceptable level. Accordingly, the present invention addresses a way of obtaining this higher selectivity using silica-based slurries to polish metal.

SUMMARY OF THE INVENTION

A method of using additives with silica-based slurries to enhance metal selectivity is described. In polishing metallic materials utilizing a chemical-mechanical polishing (CMP) process, dielectric layers (such as silicon dioxide) are eroded with relatively high rates when silica-based slurries are used. Therefore, metal removal by the use of silica-based slurries can only be achieved when metal versus oxide selectivity can be improved to an acceptable level of oxide erosion.

The present invention describes a method of using additives with silica-based slurries to passivate dielectric surfaces, such as silicon dioxide, silicon nitride, silicon oxynitride or dielectric polymers with siloxane bridges, on a semiconductor wafer so that removal rate of the dielectric layer is reduced when CMP is applied. The additive, which is comprised of at least a polar and apolar components, interacts with the surface of the dielectric layer to inhibit particles of the silica-based slurry from interacting with the surface. The additive of the preferred embodiment is an organic additive. By applying a surface passivation layer on the dielectric surface, erosion of the dielectric surface is reduced. However, the metallic surface is not affected significantly by the organic additive so that the selectivity of metal removal over dielectric removal is enhanced, allowing for silica-based slurries to be used for metal polishing.

DETAILED DESCRIPTION OF THE PREFERRED EMBODIMENTS

A chemical-mechanical polishing (CMP) of a semiconductor wafer utilizing silica-based slurries that contain an additive to enhance selectivity of metal versus a dielectric layer is described. In the following description, numerous specific details are set forth, such as specific chemicals, structures, etc., in order to provide a thorough understanding of the present invention. However, it will be obvious to one skilled in the art that the present invention may be practiced without these specific details. In other instances, well known processes and chemical compositions have not been described in detail in order not to unnecessarily obscure the present invention.

Figures 1A, 1B:
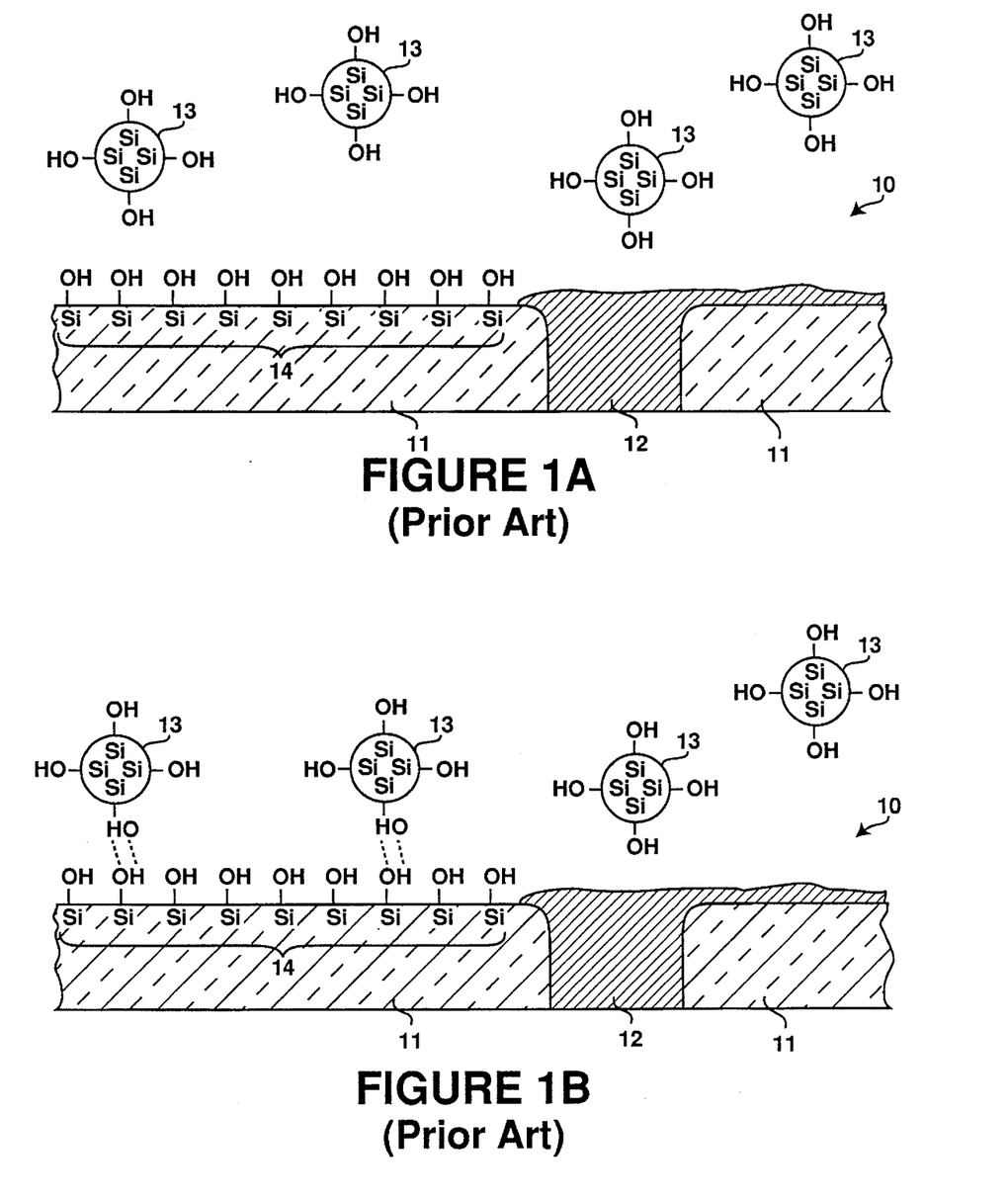
FIG. 1A is a cross-sectional diagram showing a silicon dioxide ($SiO_2$) layer and a metallic layer formed on a semiconductor wafer and in which silica-based slurry particles are introduced to polish the metallic surface.
FIG. 1B is a cross-sectional diagram of the layers described in FIG. 1A, but now showing an interaction of surface silanol groups of the $SiO_2$ layer with particles of the silica-based slurry.
Figure 1C:
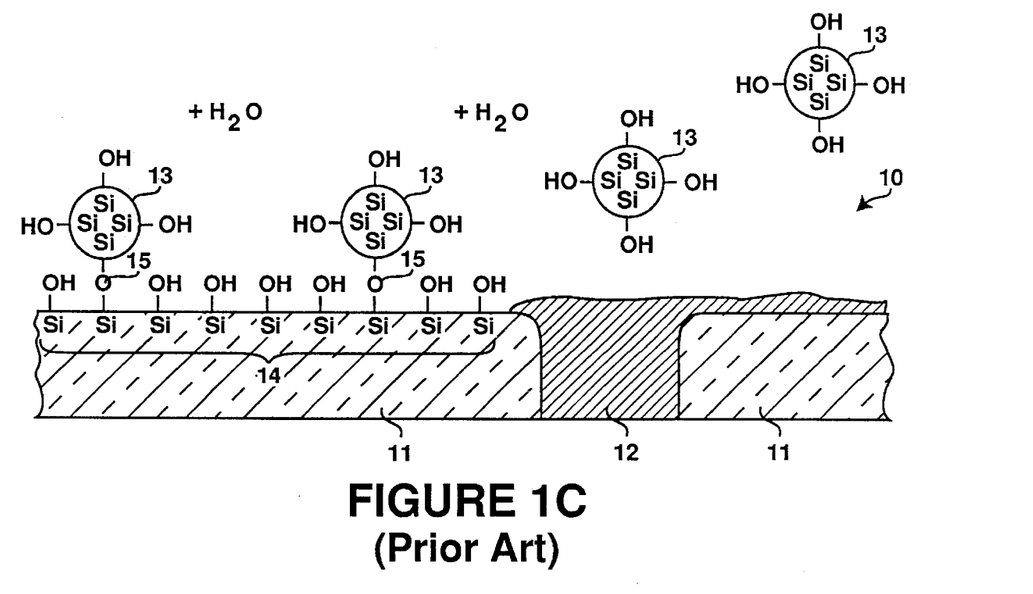
FIG. 1C is a cross-sectional diagram of the layers described in FIG. 1B, but now showing a release of water ($H_2O$) with an interaction of silica-based slurry particle with the surface silanol group of the $SiO_2$ layer.

Referring to FIGS. 1A–C (collectively referred to as FIG. 1), a problem associated with the use of a silica-based slurry to polish metallic layers is exemplified. In this prior art technique, a silica-based slurry known in the prior art is utilized to polish a semiconductor wafer 10, in which a metallic material 12 (such as a metal film) is utilized with a dielectric layer 11, such as an oxide-based (typically silicon dioxide) dielectric layer. In the description, silicon dioxide ($SiO_2$) is specifically referenced since it is a very common material for forming the dielectric layer 11. However, it is understood that other materials can comprise dielectric layer 11 (including silicon dioxide, silicon nitride, silicon oxynitride and dielectric polymers with siloxane bridges, as well as others). The metallic material 12 is utilized to provide a conductive path, such as a vertical and/or horizontal wiring, in semiconductor devices. In the example of FIG. 1, the metallic material 12 illustrates a vertical wiring connection through the $SiO_2$ layer 11. It is appreciated that FIG. 1 only shows one connection for the purpose of explaining the invention, but the present invention can be practiced with a variety of designs using a metallic layer as a conductive path.

When CMP is utilized on wafer 10 to polish away portions of the metallic material 12, it is desirable to polish away only the exposed metal 12 to a predefined level and not the exposed portions of the $SiO_2$ layer 11. At most, no more than the minimal acceptable amount of the $SiO_2$ layer should be removed during the polishing process to remove the exposed metal layer 12. Accordingly, it is desirable to have high selectivity in the removal rate of the metallic material 12 over the $SiO_2$ layer 11. However, under current practice the selectivity of metal to $SiO_2$ removal is not adequate for a manufacturable process when the prior art silica-based slurries are used.

The polishing mechanism of the $SiO_2$ layer 11 is based on an interaction of the surface silanol (SiOH) groups 14 of the $SiO_2$ layer 11 with a slurry having silica particles 13. As shown in FIG. 1, a surface hydroxyl (OH) group of some of the silica particles 13 interact with surface silanol groups 14 of the $SiO_2$ layer 11 (as shown in FIG. 1B). This interaction ultimately results in the bonding of a silica particle 13 to the surface silanol group 14 of layer 11 by forming a Si—O—Si siloxane bridge 15 with the release of $H_2O$ (as shown in FIG. 1C). This bonding contributes to the eroding of the exposed surface of layer 11.

Because of the erosion of the exposed surface of $SiO_2$ layer 11 with the use of silica-based slurries, such slurries are not desirable when CMP is used for polishing metallic materials. High selectivity can not be achieved between the $SiO_2$ and the metallic material, since $SiO_2$ erodes along with the polishing of the metallic material. One solution in overcoming this problem is the use of alumina slurries. Because alumina particles have lower chemical reactivity than silica particles on $SiO_2$, CMP of metals is preferably accomplished with alumina slurries to provide acceptable selectivity. However, the disadvantages of using alumina slurries have been detailed in the Background section above.

Figure 2A:
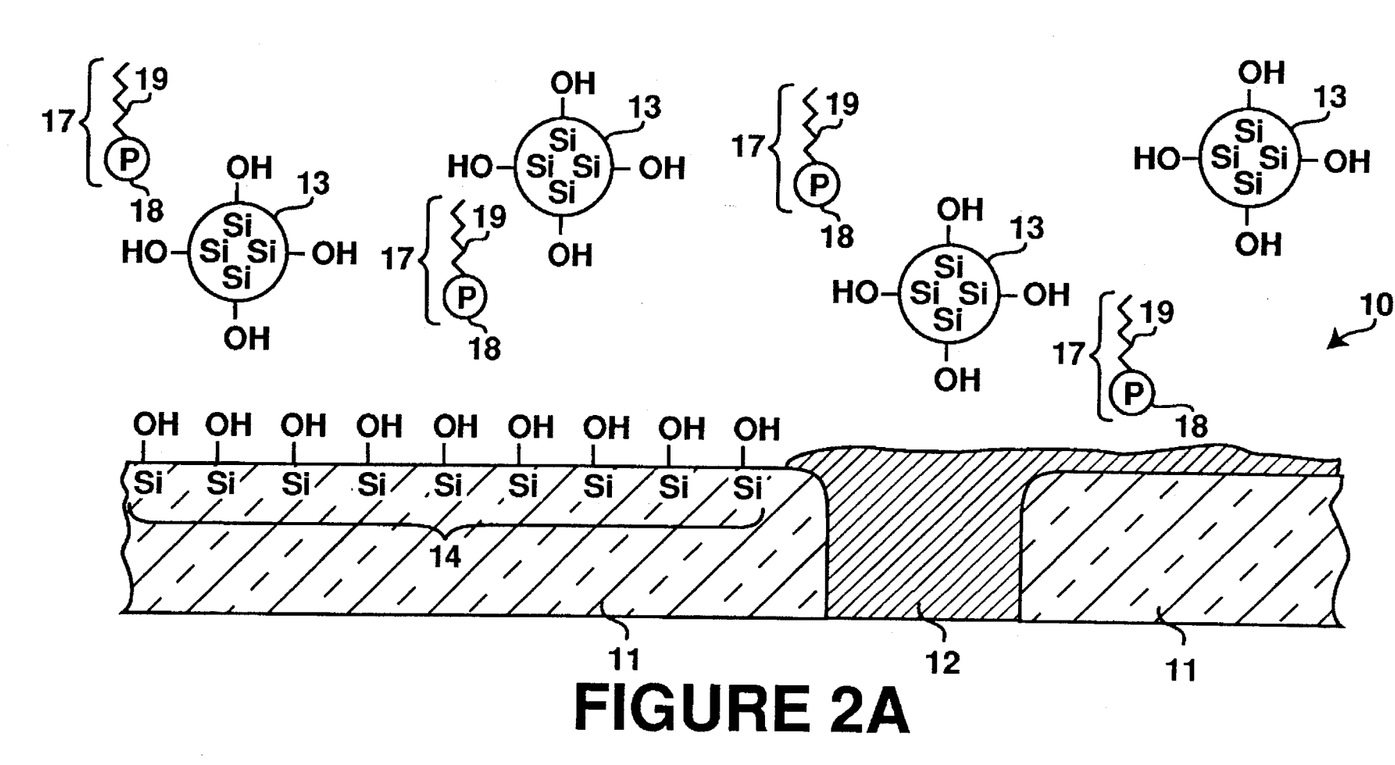
FIG. 2A is a cross-sectional diagram showing a silicon dioxide ($SiO_2$) layer and a metallic layer formed on a semiconductor wafer and in which silica-based slurry particles along with an additive of the present invention are introduced to polish the metallic surface.
Figure 2B:
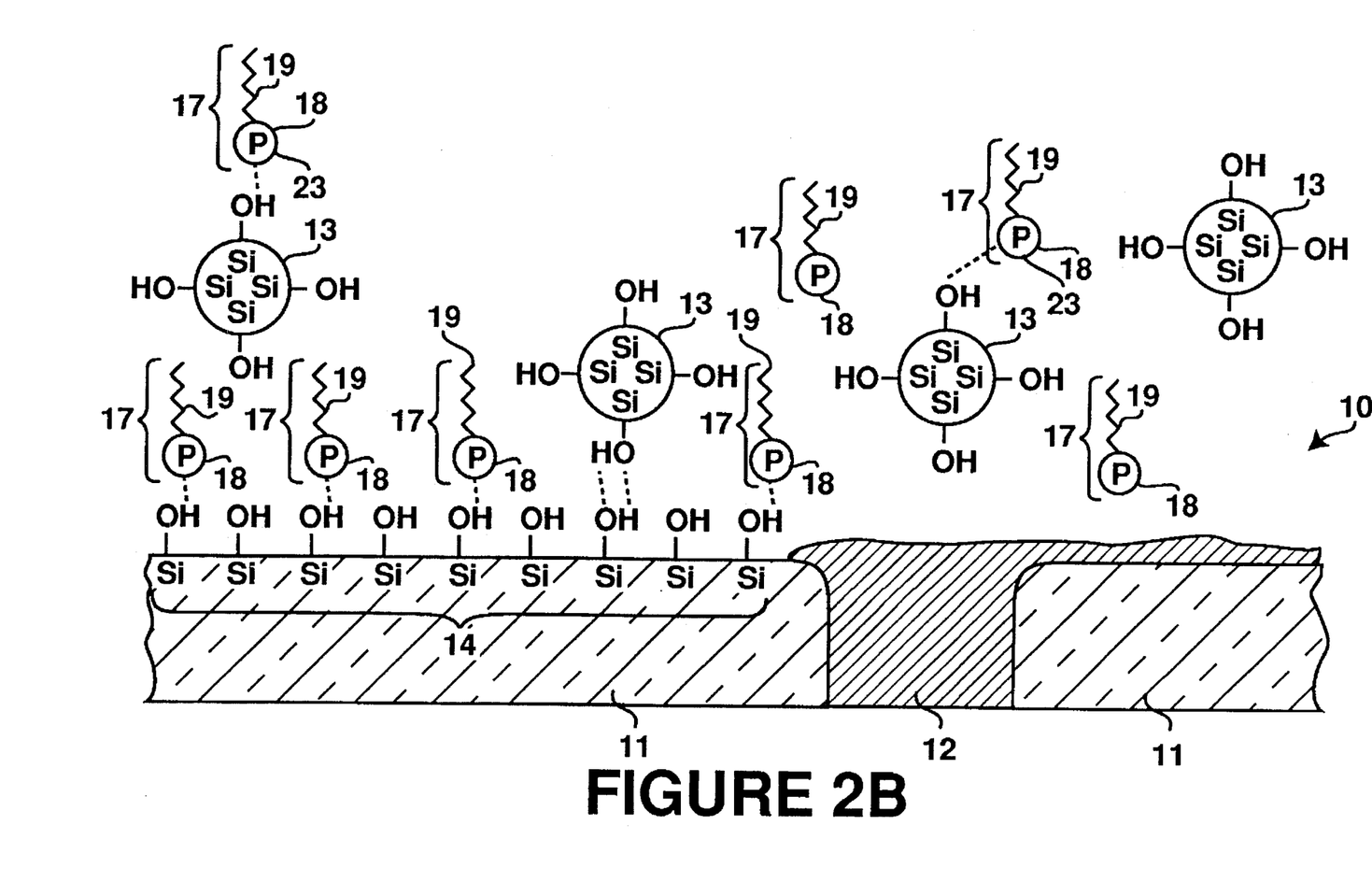
FIG. 2B is a cross-sectional diagram of the layers described in FIG. 2A, but now showing interactions of the additive with surface silanol groups when used with the slurry shown in FIG. 2A.
Figure 2C:
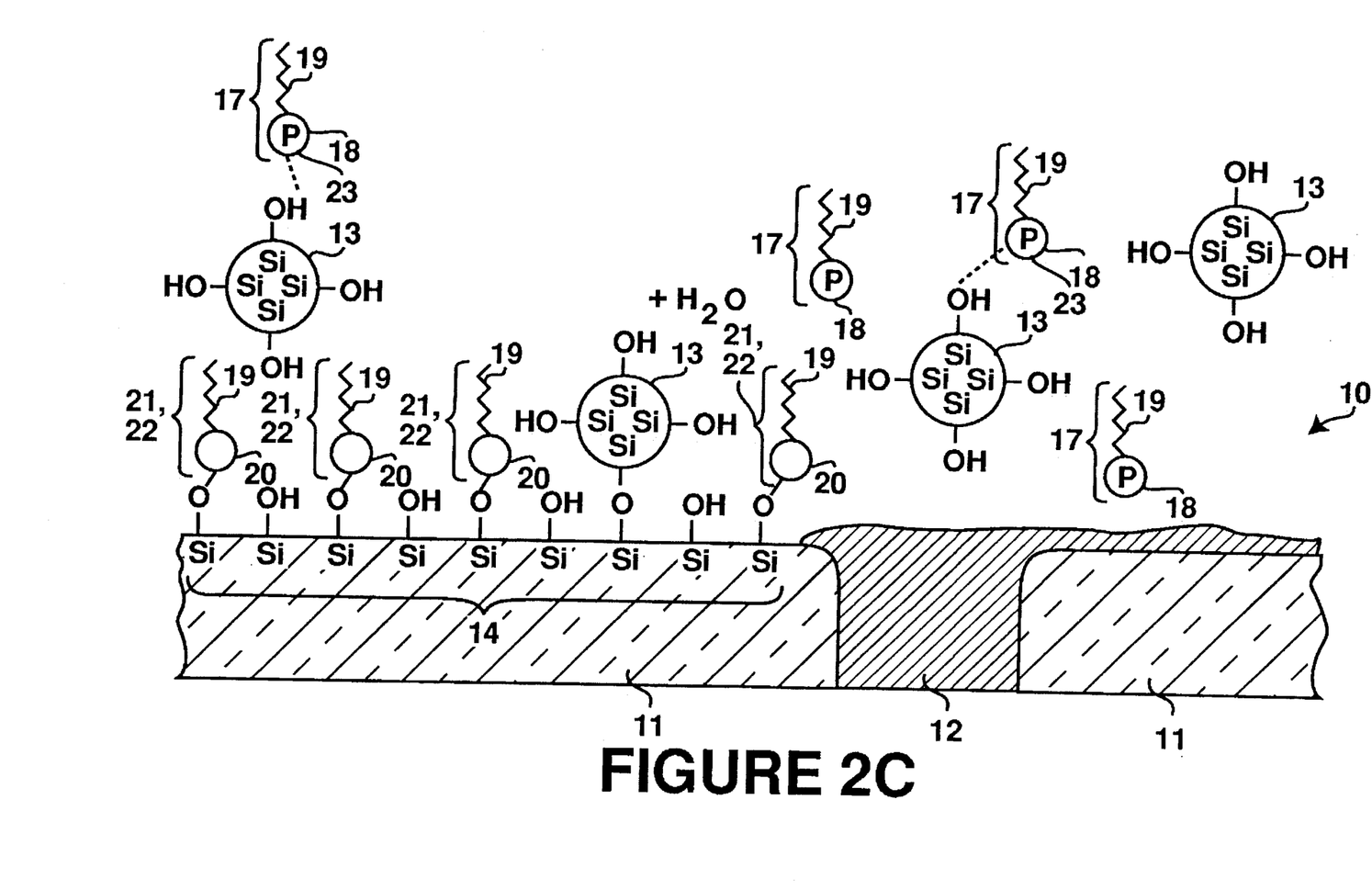
FIG. 2C is a cross-sectional diagram of the layers described in FIG. 2B, but now showing passivation of the $SiO_2$ layer by the additive in order to reduce the removal rate of the $SiO_2$ layer versus the metallic layer.

Referring to FIGS. 2A–C (collectively referred to as FIG. 2), a method of the present invention to obtain higher selectivity while using silica-based slurries to polish metal is illustrated. In accordance with the practice of the present invention, additives are introduced to improve the selectivity between metal and dielectric material (such as $SiO_2$) when silica-based slurries are used. It is appreciated that the preferred embodiment is described in reference to a particular dielectric layer, namely an oxide layer formed from $SiO_2$. However, the present invention can be practiced with other dielectric materials (such as nitrides) as well. Examples of silicon based dielectric materials are silicon dioxide, silicon nitride, silicon oxynitride and dielectric polymers with siloxane bridges. It is to be noted that these materials are provided for exemplary purpose and not for the purpose of limiting the invention.

The additives of the present invention are for the purpose of enhancing the selectivity between the metal and the dielectric layer, such as $SiO_2$. The present invention is based on an observation that the removal rate of the dielectric layer can be reduced and, therefore, the selectivity of metal removal over dielectric layer removal can be increased, by modifying the surface sites of the dielectric layer with appropriate additives compatible with the aqueous environment of the silica-based slurry.

In FIG. 2A, a silica-based slurry comprised of silica particles 13, but having a chemical additive 17 of the present invention is shown. The chemical additive 17 of the preferred embodiment is an organic additive that is introduced in the aqueous environment of the silica-based slurry for the purpose of performing CMP on wafer 10 to selectively polish metallic material 12. It is to be noted that the chemical additive need not be necessarily organic to obtain the results of the present invention. The chemical additives 17, which are also referred to as reagents, are mixed with a silica-based slurry normally used in the prior art (as described in reference to FIG. 1). The additive 17 is typically combined with the slurry to operate in an aqueous environment in which CMP is performed. It is to be noted that the additive can be added to the bulk slurry for dispensing onto a wafer or, alternatively, the additive can be dispensed separately onto the wafer surface to mix with the slurry as the slurry is dispensed. The technique selected is a matter of design choice, but may depend on the "shelf-life" of the particular slurry once an additive is combined with the base slurry.

A primary purpose of the chemical additive 17 is to passivate the $SiO_2$ surface 11 by blocking or replacing the surface functional groups so that interaction between the $SiO_2$ 11 and the slurry is reduced. A process for this passivation is based on the reaction of the surface silanol group 14 (previously discussed in reference to FIG. 1) with the additive 17. Essentially, some of the surface silanol groups 14 react with the additive 17, where these silanol groups 14 would normally react with the silica particles 13. Instead of having a potential for the silanol group(s) 14 to bond with the silica particles 13, many of these silanol groups 14 now bond with the additive 17 to passivate the $SiO_2$ surface.

The chemical additive 17 of the preferred embodiment is comprised of one or more polar component (or group) 18 (the polarization is denoted by the letter "P") and one or more apolar component (or group) 19. For simplicity of illustration in FIG. 2, the additive 17 is shown with a singular polar component 18 attached to a singular apolar component 19. The invention is operative due to the interaction of the polar components 18 with the surface silanol group(s) 14 of the $SiO_2$ surface. The physical interaction or chemical reaction between the polar group(s) 18 and the surface silanol group(s) 14 (as shown in FIG. 2B) results in a formation of an interacted apolar organic component 20 on the $SiO_2$ surface 11 (as shown in FIG. 2C). It is to be noted that the polar component 18 interacts with the surface hydroxyl group of the silanol group 14 so that what was the polar component 18 is now an interacted polar component 20. The interacted polar component 20 and the apolar component 19 now form an apolar attached component or molecule 21. Thus, the Si—O-component 20 link passivates the surface of layer 11 by forming a surface layer of apolar attached molecules 21.

This passivation layer 22, comprised of molecules 21, reduces the interaction between the abrasive particles 13 and the $SiO_2$ surface 11 due to the replacement or steric shielding of the reactive hydroxyl sites of the $SiO_2$ surface 11. Thus, erosion of the $SiO_2$ layer 11 can be reduced significantly by the presence of the passivating layer 22. The reduction in the erosion rate of the $SiO_2$ to the silica slurry improves the selectivity of metal polish versus $SiO_2$ polish, since the organic additive 17 usually has significantly weaker interaction with the metal surface 12.

As also shown in FIGS. 2B–C, some polar components 23 may bond with the silica particle(s) 13. This bonding of the additive 17 to the silica particle 13 reduces available hydroxyl components of particle 13, which potentially could bond with the $SiO_2$ surface 11. However, it is to be appreciated that the passivation of the $SiO_2$ surface 11 is of more significant concern in the practice of the present invention.

The specific interaction and the reaction product(s) depend on the specific polar and apolar components 18 and 19 of additive 17. Although a variety of chemical elements and/or compounds fit into the two groups 18 and 19 described above, some examples are noted below. It is to be appreciated that the listing of these components is strictly for providing examples and these components are not listed for the purpose of limiting the present invention.

Depending on the nature of the polar component 18 introduced, it can be anionic, cationic or non-ionic. Examples for each of the three categories for the polar component 18 of additive 17 are provided below. Again, it is to be appreciated that these examples are not provided for the purpose of limiting the invention.

Anionic

Potassiumbutylsulphate $C_3H_7SO_4^-K^+$

Other typical compounds in this category are, sulfates ($SO_4^-$), alkylsulfonates ($C_xH_ySO_4^-$). The positive ion can be of different alkali elements such as calcium (Ca), sodium (Na) and potassium (K).

Cationic

Tetrabutylammonium hydroxide $(C_3H_7)_4N^+OH^-$

Typical representatives of these groups are the quaternary ammonium compounds, the negative ion besides $OH^-$, can be different halogens such as bromine (Br), fluorine (F) and iodine (I).

Non-ionic

Butanol $C_3H_7OH$

Several other, non-ionic polar components are amines (—NH), amides acetamide ($CH_3CONH$—), trifluoro acetamide ($CF_3CONH$—), urea ($OC(NH—)_2$), imidazole ($C_6H_6N_2$), glycol (—$CH_2OH$) and phenol ($C_6H_5OH$) groups.

Figure 3:
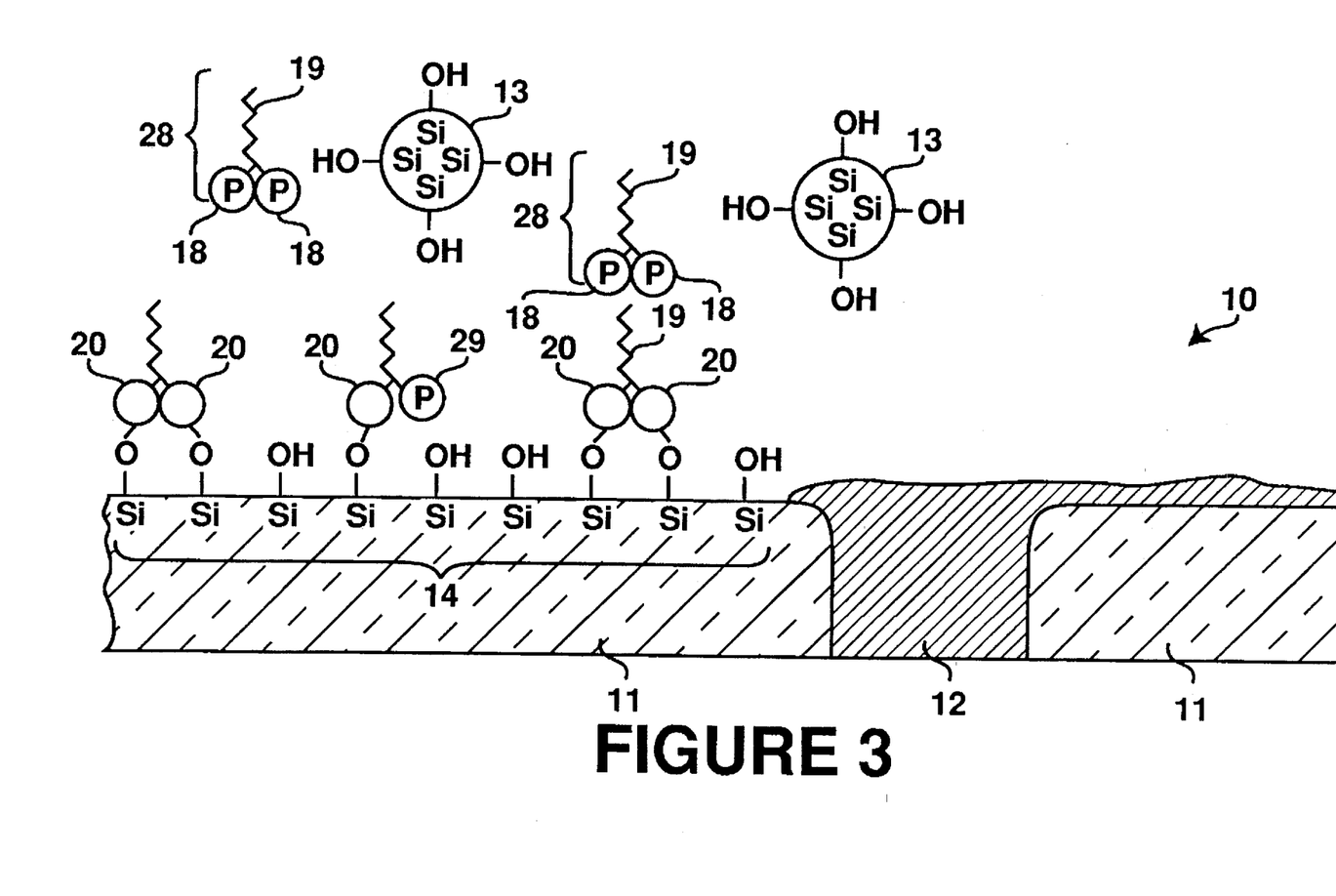
FIG. 3 is a cross-sectional diagram of the layers described in FIGS. 2A–C, but now with the use of a multi-functional additive as the slurry additive to passivate the $SiO_2$ surface.

Depending on the number of the polar components the additive can be monofunctional (one polar component) or multi-functional (more than one polar component). Monofunctional additive (as shown in FIG. 2) interact dominantly with one surface silanol group 14. A multi-functional reagent can interact with more than one silanol group of surface 11. Therefore, larger numbers of the silanol groups 14 can be replaced. The use of a multi-functional polar additive for passivating a dielectric surface is shown in FIG. 3. In the example of FIG. 3, an additive 28 having two polar components 19 is shown. In FIG. 3, both polar components 19 of the additive 28 can react or only one polar component 19 may react with surface 11. However, it should be noted that an non-reacted polar component 29 can remain on the surface, which then can become interactive sites for the abrasive particles.

It is appreciated that various polar component additives can be introduced for surface passivation in the practice of the present invention and therefore, the additive need not be limited to one chemical compound from the perspective of passivating the surface. Furthermore, although not illustrated, multiple apolar components 19 can be used with one polar component or multiple polar components. Thus, such apolar organic components can be branched or linear. Some of the typical apolar organic components for use in the practice of the present invention are: methyl ($CH_3$), ethyl ($CH_3$—$CH_2$), isopropyl (($CH_3)_2$—CH—), butyl (($CH_3$—$(CH_2)_3$—), phenyl ($C_6H_5$), hydrocarbon chain ($CH_3$—$(CH_2)_n$), fluorocarbon chain ($CF_3$—$(CF_2)_n$). In general, larger apolar groups provide more efficient shielding, but provide reduced solubility in an aqueous environment.

The selection of which polar and apolar organic group(s) to use, as well as the selection of monofunctional polar or multi-functional polar component, is a design choice. So is the utilization of a combination of different additives. However, the selection of the polar component must take into consideration that those with a strong proton acceptor may hydrolyze in an aqueous solution before interacting with the oxide surface, thereby reducing the efficiency of the surface shielding effect. The selection of which additive(s) to use will depend on the particular process and the material(s) being polished. Additionally, the composition of the slurry, pH of the slurry solution, viscosity of the slurry solution and shelf life of the slurry will determine which additive(s) are best suited for a given use.

The amount of the selectivity obtained will depend, not only on the additive selected, but also on the particular metal being polished. For example, when polishing tungsten using a silica based slurry combined with a butanol additive of 3 w %, selectivity can be enhanced by as much as 3–5. With softer metals, such as copper and aluminum, similar selectivity enhancement can be obtained at a faster CMP removal rate.

Thus, a method of using organic additive with silica-based slurries to enhance metal selectivity over dielectric material when performing metal CMP is described.

We claim:

1. A method of passivating a surface of a dielectric layer of a semiconductor wafer in order to reduce removal rate of said surface when said surface is subjected to chemical-mechanical polishing in presence of an aqueous slurry wherein particles of said slurry interact to erode said surface, comprising the steps of:

introducing a chemical additive having a polar component and an apolar component to said slurry wherein said polar component of said chemical additive interacts with functional groups present at said surface to form an interacted apolar passivation layer over said surface, so that functional groups which would normally interact with said slurry for erosion of said surface to occur are significantly restricted from interacting with said slurry;

performing chemical-mechanical polishing wherein said passivation layer inhibits erosion of said surface to reduce said removal rate.

2. The method of claim 1 wherein the step of introducing said chemical additive introduces an additive having multiple polar components and an apolar component.

3. The method of claim 1 wherein the step of introducing said chemical additive introduces an organic additive having at least one polar component and an apolar component.

4. The method of claim 1 wherein said slurry is a silica-based slurry without having metallic-oxide abrasive particles suspended therein.

5. A method of passivating a surface of a dielectric layer of a semiconductor wafer when chemical-mechanical polishing is performed on said wafer to remove metallic material from said wafer, wherein in order to reduce removal rate of said dielectric surface when said dielectric surface is subjected to chemical-mechanical polishing as well in presence of an aqueous slurry, wherein particles of said slurry interact to polish said dielectric surface and said metallic material, comprising the steps of:

introducing a chemical additive having a polar component and an apolar component to said slurry wherein said polar component of said chemical additive interacts with surface hydroxyl groups associated with said dielectric surface to form an interacted apolar passivation layer over said dielectric surface, so that surface hydroxyl groups which would normally interact with said slurry for erosion of said surface to occur are significantly restricted from interacting with said slurry;

performing chemical-mechanical polishing wherein said passivation layer inhibits erosion of said dielectric surface to increase selectivity of metal removal over dielectric removal.

6. The method of claim 5 wherein the step of introducing said chemical additive introduces an additive having multiple polar components and an apolar component.

7. The method of claim 5 wherein the step of introducing said chemical additive is for passivating a dielectric surface comprised of an oxide layer.

8. The method of claim 5 wherein the step of introducing said chemical additive is for passivating a dielectric surface comprised of a silicon dioxide layer.

9. The method of claim 5 wherein said slurry is a silica-based slurry without having metallic-oxide abrasive particles suspended therein.

10. The method of claim 5 wherein the step of introducing said chemical additive introduces an organic additive having at least one polar component and an apolar component.

11. A method of passivating a surface of a silicon dioxide ($SiO_2$) layer of a semiconductor wafer when chemical-mechanical polishing is performed on said wafer to remove metallic material from said wafer, wherein in order to reduce removal rate of said $SiO_2$ layer when said $SiO_2$ layer is subjected to chemical-mechanical polishing as well in presence of an aqueous slurry wherein molecular particles of said slurry interact to polish said $SiO_2$ layer and said metallic material, comprising the steps of:

introducing a chemical additive having a polar component and an apolar component to an aqueous environment of said slurry wherein said polar component of said chemical additive interacts with surface silanol groups of said $SiO_2$ layer to form an interacted apolar passivation layer over said $SiO_2$ layer, so that silanol groups which would normally interact with said slurry for erosion of said surface to occur are significantly restricted from interacting with said slurry;

performing chemical-mechanical polishing wherein said passivation layer inhibits erosion of said $SiO_2$ layer in order to increase selectivity of metal removal over $SiO_2$ removal.

12. The method of claim 11 wherein the step of introducing said chemical additive introduces an additive having multiple polar components and an apolar component.

13. The method of claim 11 wherein said slurry is a silica-based slurry without having metallic-oxide abrasive particles suspended therein.

14. The method of claim 11 wherein the step of introducing said chemical additive introduces an organic additive having at least one polar component and an apolar component.

* * * * *